United States Patent
Jian et al.

(10) Patent No.: US 6,670,801 B2
(45) Date of Patent: Dec. 30, 2003

(54) SECOND HARMONIC TUNING OF AN ACTIVE RF DEVICE

(75) Inventors: Heng-Yu Jian, Los Angeles, CA (US); Thomas Marra, San Diego, CA (US)

(73) Assignee: Telefonaktiebolaget L.M. Ericsson (SE)

( * ) Notice: Subject to any disclaimer, the term of this patent is extended or adjusted under 35 U.S.C. 154(b) by 182 days.

(21) Appl. No.: 09/920,276

(22) Filed: Jul. 31, 2001

(65) Prior Publication Data

US 2003/0025487 A1 Feb. 6, 2003

(51) Int. Cl.$^7$ ................................................ G01R 23/04
(52) U.S. Cl. ........................... 324/95; 330/294; 330/306
(58) Field of Search .................... 324/95, 158.1, 324/76.35, 508; 330/53, 56, 107, 109, 27, 251, 290, 306, 294; 327/317, 310, 551, 169

(56) References Cited

U.S. PATENT DOCUMENTS 4,047,127 A * 9/1977 Alexander .................. 332/174
6,388,546 B1 * 5/2002 Kikokawa et al. .......... 333/218

* cited by examiner

*Primary Examiner*—Kamand Cuneo
*Assistant Examiner*—Trung Q. Nguyen
(74) *Attorney, Agent, or Firm*—Coats & Bennett, P.L.L.C.

(57) ABSTRACT

Second-order harmonic tuning of an active device, such as a transistor used in a radio frequency (RF) power amplifier circuit, is accomplished by positioning a quarter-wavelength stub along a transmission line coupled to an output of the device, such that the output is presented with a desired impedance for the second harmonic.

20 Claims, 2 Drawing Sheets

SECOND HARMONIC TUNING OF AN ACTIVE RF DEVICE

FIELD OF THE INVENTION

The present invention pertains generally to the field of radio frequency (RF) devices and, more specifically, to techniques for second-order harmonic tuning of active RF devices. By way of non-limiting example, the invention relates to RF power amplification circuits in wireless communication devices and networks.

BACKGROUND OF THE INVENTION

The use of transistor devices as signal amplifiers in wireless communication applications is well known. With the considerable recent growth in the demand for wireless services, such as personal communication services, the operating frequency of wireless networks has increased dramatically and is now well into the gigahertz (GHz) frequencies. At such high frequencies, Gallium Arsenide field effect transistors (GaAs FETs) have been preferred for power amplification applications, since GaAs FETs have a relatively high saturation power efficiency at frequencies of a few giga-hertz, e.g., at 2 GHZ.

RF transistors, such as GaAs FETs are commonly employed in power amplifier circuits in wireless communication devices for amplification of RF signals transmitted at a fundamental frequency $f_0$. Generally, the amplified signal at the output of the RF transistor not only includes the fundamental frequency $f_0$, but also a second-order harmonic frequency $2f_0$ ("second harmonic") due to non-linearity in the RF transistor. Using second-order harmonic tuning, the power efficiency of the RF transistor can be improved by suppressing the second harmonic at the output of the RF transistor.

SUMMARY OF THE INVENTION

The present invention is directed to providing second harmonic tuning of active devices, such as RF transistors, used in RF amplifier circuits.

An amplifier, built in accordance with one embodiment of the invention, comprises a RF transistor having an output terminal, a quarter wavelength stub, a transmission line and an impedance matching network. The impedance matching network is coupled between the output terminal of the RF transistor and the transmission line. The quarter wavelength Stub provides a short circuit for the second harmonic in the amplified output signal, and is positioned along the transmission line such that the RF transistor is presented with a desired output impedance for tuning the second harmonic.

In one embodiment, the quarter wavelength stub may be coupled to a direct current (DC) voltage bias source for DC biasing to the output of the RF transistor.

In accordance with another aspect of the invention, a test structure is used to determine the position of the ¼ wavelength stub along the transmission line that results in an optimal (or otherwise desired) impedance at the output of the RF transistor for tuning the second harmonic. The test structure comprises a transmission line and a plurality stubs on the same side of a dielectric layer with a ground plate on the opposite side of the dielectric layer. Each one of the stubs on the test structure is spaced from the transmission line by a gap at different positions along the transmission line. The impedance at the output of the RF transistor for the second harmonic can be measured for each one of the stubs on the test structure by connecting the gap end of the respective stub to the transmission line. The impedance at the output of the RF transistor is measured for different stubs on the test structure until the impedance measurement for one of the stubs approximates optimal or desired impedance.

Other objects and features of the present invention will become apparent from consideration of the following description taken in conjunction with the accompanying drawings.

BRIEF DESCRIPTION OF THE DRAWINGS

The drawings illustrate both the design and utility of the preferred embodiments of the present invention, wherein.

DETAILED DESCRIPTION OF THE PREFERRED EMBODIMENTS

The present invention is believed to be applicable to a variety of applications in which second harmonic tuning of an active RF device is desirable. The present invention is particularly applicable and beneficial for second harmonic tuning of a RF field effect transistor operated as a common-source amplifier. While the present invention is not so limited, an appreciation of the present invention is presented by way of a exemplary application in a FET-based RF power amplifier circuit.

Figure 1:
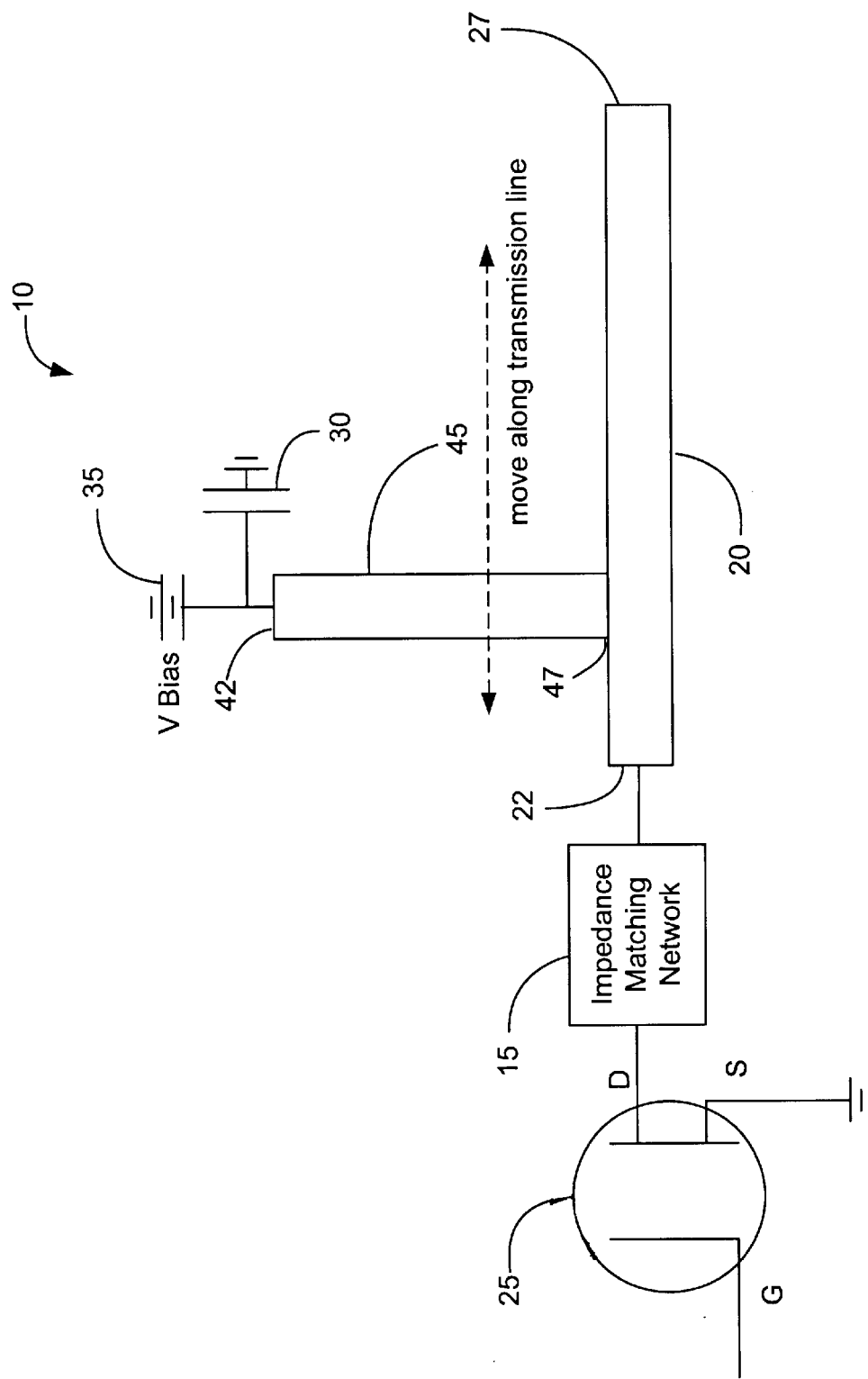
FIG. 1 is a diagram of a power amplifier according to an embodiment of the invention.

FIG. 1 shows a circuit schematic of a RF amplifier circuit 10 constructed in accordance with one embodiment of the invention. The amplifier 10 includes a GaAs FET 25 operated as a common-source amplifier, with an input signal applied to the gate terminal ("G"), the output signal received off the drain terminal ("D"), and the source terminal ("S") providing a relative ground for the common element current path. In alternate embodiments, the RF transistor 25 could be a bipolar transistor connected as a common-emitter or common-base amplifier, as is known in the art. An impedance matching network 15 has an input coupled to the drain D of the transistor 25, and a first end of a transmission line 20 is coupled to an output of the impedance matching network 15, respectively. A second end 27 of the transmission line 20 forms the output of the RF power amplifier circuit 10.

A quarter wavelength (¼ λ) stub 45 is connected at a selected location along the transmission line 20, where λ is the wavelength of the fundamental frequency $f_0$ the transistor 25. in one embodiment, the transmission line 20 is a micro strip having characteristic impedance of, e.g., 50 ohms. Preferably, the respective transmission line 20 and ¼ λ stub 45 are placed on the same side of a dielectric layer (not shown) with a ground plate (not shown) placed on the opposite side of the dielectric layer of the micro strip conductor. By way of example, the dielectric layer may be made of a Teflon® material with a dielectric constant of 3, and a thickness of between 20 and 30 mils.

The impedance matching network 15 transforms the impedance from the input 22 of the transmission line 20 to the drain terminal D of the transistor 25. By way of example, while the transmission line may have a characteristic impedance of 50 ohms, the drain terminal D of the transistor may have an impedance of only 2 ohms at the fundamental frequency $f_0$. As is known in the art, the impedance matching network 15 may comprise different length. Typically, at frequencies of a few gigahertz, e.g., 2 GHz, the majority of impedance matching is done using micro strip matching networks. Capacitors are sometimes used to also provide some additional impedance matching and to fine-tune the matching networks. The impedance matching network 15 may also include impedance associated with a package containing of the transistor 25, which is used to perform internal (i.e., internal to the device package) impedance matching.

A voltage bias source 35 is used to DC bias the output of the transistor 25 through the ¼ λ stub 45, the transmission line 20 and the impedance matching network 15, respectively. The RF capacitor 30 provides a short circuit to ground for the RF output signal at an end 42 of the ¼ λ stub 45 located away from the transmission line 20. For a fundamental transistor frequency $f_0$ of 2 GHz, the RF capacitor 30 may have a capacitance value of between 10 and 30 pF. The ¼ λ stub 45 transforms the short circuit into an open circuit for the fundamental frequency $f_0$ at the other end 47 of the ¼ λ stub 45, which is connected to the transmission line 20. For the second harmonic, however, the ¼ λ stub transforms the open circuit back into a short circuit at the end 47 of the ¼ λ stub connected to transmission line 20. This is because the length of the ¼ λ stub 45 is half a wavelength with respect to the second harmonic instead of a quarter of a wavelength at the fundamental.

Thus, the end 47 of the ¼ λ stub 45 connected to the transmission line 20 provides an open circuit for the fundamental $f_0$ of the RF output signal and a short circuit for the second harmonic of the RF output signal. As a result, the end 47 of the ¼ λ stub connected to the transmission line 20 blocks the fundamental frequency $f_0$ from the voltage bias source 35 and suppresses, i.e., short circuits, the second harmonic.

In order to improve the saturation power efficiency of the RF transistor 25, it is desirable to suppress, i.e., short circuit, the second harmonic at the output of the RF transistor 25. in accordance with one aspect of the invention, this is accomplished by connecting the ¼ λ stub 45 at a location on the transmission line 20 such that the resulting impedance transformation due to the length of the transmission line 20 between the ¼ λ stub 45 and the end 47 of the transmission line 20 substantially compensates for the impedance transformation of the second harmonic in the impedance transformation network 15. In this manner, the short circuit for the second harmonic at the end 22 of the ¼ λ stub 45 connected to the transmission line 20 is transformed back into a short circuit at the output of the RF transistor 25. Notably, it is assumed that the impedance transformation due to the impedance matching network 15 is primarily reactive, i.e., loss-less, so that a length of the transmission line 20 can be used to compensate for it.

In preferred embodiments, the position of the ¼ λ stub 45 along the transmission line 22 is adjusted until an impedance measurement at the output of the RF transistor 25 is approximately an optimal desired impedance for the second harmonic. Due to the internal matching typically found in most RF device packages, the optimal or desired impedance at the output of a RF device package will not be a short circuit. This is because the short circuit has to appear at the actual semiconductor die of the RF transistor 25 and not the output at the RF device.

For example, in one embodiment, a micro strip, e.g., a copper micro strip, having a length of ¼ λ is used for the ¼ λ stub 45. The micro strip 45 is placed next to the transmission line 20 at an initial position along the transmission line 20. Preferably, the micro strip 45 is placed on the same dielectric layer (not shown) as the transmission line 20. The micro strip 45 is connected at one end 47 to the transmission line 20, e.g., with copper tape, and at the other end 42 to the voltage bias source 35 and the RF capacitor 30. The impedance at the output of the RF transistor 25 is then measured for the second harmonic. To hold the micro strip 45 in place during the impedance measurement, the micro strip 45 may be provided with an adhesive coating on the side contacting the dielectric layer. For this purpose, a piece of copper tape cut to a length of ¼ λ may be used for the micro strip 45.

If the impedance measurement at the output of the RF transistor 25 is not close enough to the desired impedance for the second harmonic at the initial position, the micro strip 45 is moved in either direction (indicated by the dashed double arrow in FIG. 1) to a new position along the transmission line 20, where the impedance measurement is taken again. This procedure may be repeated a number of times until the impedance measurement at the output of the transistor 25 is close enough to the desired impedance for the second harmonic. Once the position along the transmission line is found, the position may be recorded. The recorded position may then be used to position the ¼ λ stub for other RF power amplifiers having the same RF transistor 25 and inner connections as the measured power amplifier 10.

Figure 2:
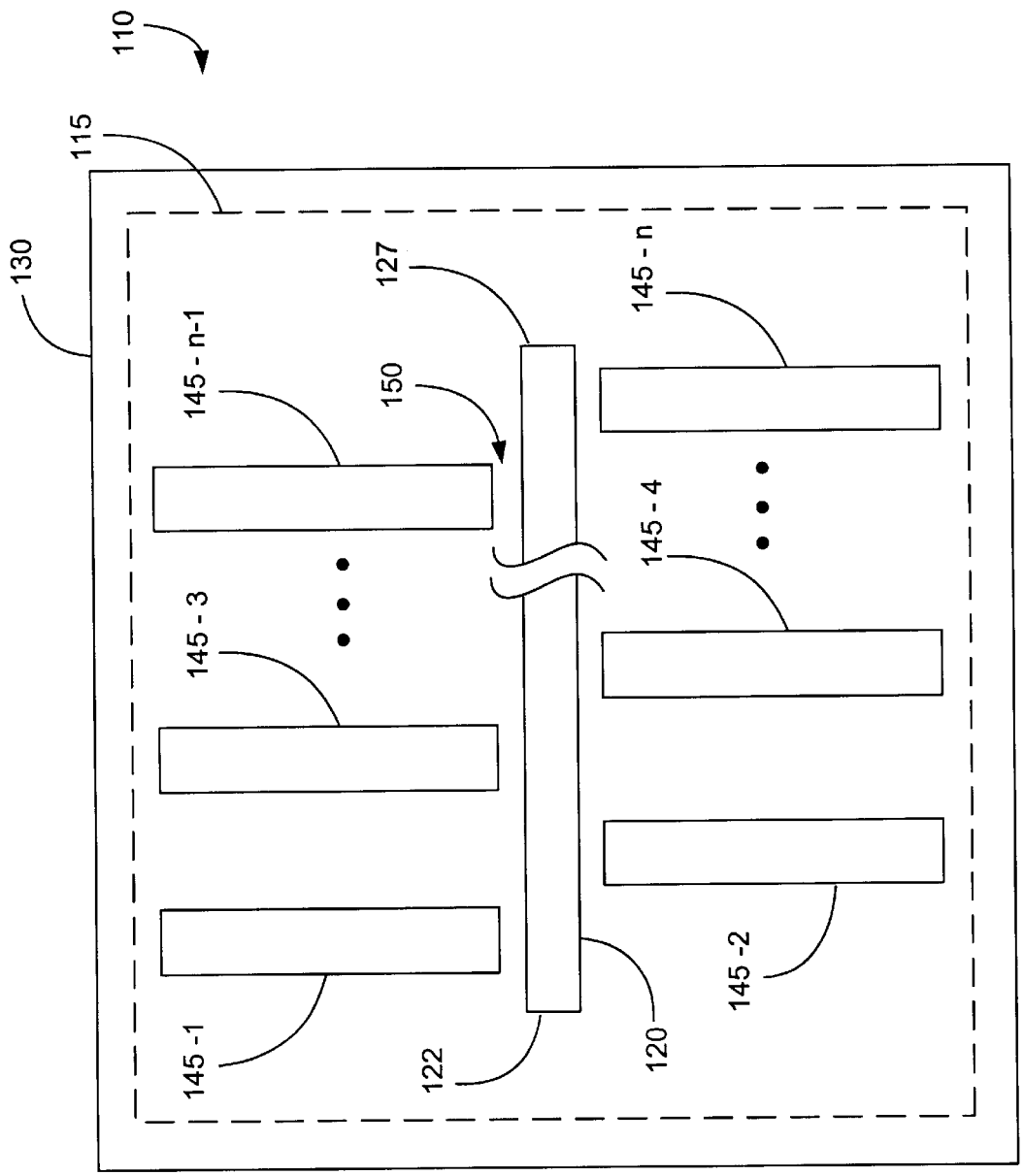
FIG. 2 is a diagram of a test structure according to an embodiment of the invention.

In accordance with a further aspect of the invention, FIG. 2 shows a test structure 110 that may be used for locating the shunt inductance (e.g., ¼ λ stub 45) along an output transmission line of an amplifier circuit, such as amplifier circuit 10, for second harmonic tuning. The test structure is used in conjunction with a selected active device, e.g., an RF transistor, and output impedance matching network (not shown), which are selected to match the device and impedance network of the particular amplifier circuit to be tuned with the test structure 110.

More particularly, the test structure 110 comprises a ground plate 115 having an attached dielectric layer 130. A transmission line 120 having a first end 122, a length, and a second end 127, which may be realized using a micro strip, is located on a top surface of the dielectric layer 130, electrically isolated from the ground plate 115. A plurality of ¼ λ micro strip stubs $145_{1-n}$ are also disposed on the top surface of the dielectric layer 130, alternating on either side of the transmission line 120. In particular, the ¼ λ stubs $145_{1-n}$ 1 extend perpendicularly along the length of the transmission line 120, each stub 145 slightly farther from the first end 122 and electrically isolated from the transmission line 120 by a uniform gap 150.

The impedance at the output of the RF transistor being tuned may be measured at each one of the ¼ λ stubs $145_{1-n}$ on the test structure 110 by connecting the gap end 150 of a respective ¼ λ stub $145_i$ to the transmission line 120. For example copper tape, a RF capacitor, soldering a piece of copper foil between the stub and the transmission line, or the like, may be used to make the connection. The other end of the respective ¼ λ stub $145_i$ is connected to a DC voltage bias source and grounded RF capacitor, while end 122 of the transmission line 120 is connected via the impedance matching network to the RF transistor being tuned.

The impedance at the output of the transistor is measured for different ¼ λ stubs $145_{1-n}$ on the test structure 110, until a desired second harmonic output impedance is measured for one of the ¼ λ stubs $145_i$. Once the particular ¼ λ stub $145_i$ providing a desired second harmonic output impedance is determined, the position of the respective ¼ λ stub $145_i$ along the transmission line 20 is recorded. The recorded position(s) may then be used to position ¼ λ stubs in RF power amplifier circuits employing the same transistor and inner matching connections as the measured transistor.

While various embodiments of the application have been described, it will be apparent to those of ordinary skill in the art that many embodiments and implementations are possible that are within the scope of the present invention.

For example, although the invention has been described herein in an application for providing second harmonic tuning of a GaAs FET transistor used as a RF power transistor, those skilled in the art will appreciate that the invention may be used to provide an optimal or desired impedance for the second harmonic tuning of other active transistor devices, such as bipolar devices and other FET devices. Thus, the invention is not to be restricted or limited except in accordance with the following claims and their equivalents.

What is claimed:

1. A circuit for amplifying a radio frequency (RF) signal having a fundamental frequency, comprising:
   an active device having an output;
   a transmission line having one end coupled to the active device output, and a length; and
   a stub having a length approximately equal to ¼ of the wavelength of the fundamental frequency, and a first end connected along the length of the transmission line, the stub being selectively positioned along the length of the transmission line such that the active device output is presented with a desired impedance corresponding to a short circuit at a second harmonic of the fundamental frequency appearing at the semiconductor die of the active device.

2. The amplifier circuit of claim 1, wherein the first end of the stub provides an open circuit for the fundamental frequency.

3. The amplifier circuit of claim 1, wherein the transmission line is a micro strip.

4. The amplifier circuit of claim 1, wherein a second end of the stub is connected to a voltage bias source for DC biasing the active device output.

5. The amplifier circuit of claim 1, wherein the active device is a RF transistor.

6. The amplifier circuit of claim 1, wherein the active device is a field effect transistor operated as a common-source amplifier.

7. The amplifier circuit of claim 1, further comprising an impedance matching network coupled between the active device output and the first end of the transmission line.

8. The amplifier circuit of claim 1 wherein the first end of the stub provides a short circuit for the second harmonic of the fundamental frequency.

9. A wireless communication device comprising:
   a circuit for amplifying a radio frequency (RF) signal, the RF signal having a fundamental frequency, the amplifier circuit comprising:
   a transistor having an output;
   a transmission line having one end coupled to the transistor output and a length; and
   a shunt inductance stub having a first end connected along the length of the transmission line to provide an open circuit for the fundamental frequency, the stub being selectively positioned along the length of the transmission line such that the device output is presented with a desired impedance corresponding to a short circuit at a second harmonic of the fundamental frequency appearing at the semiconductor die of the transistor.

10. The wireless communication device of claim 9, further comprising a capacitor connected at a second end of the stub, the capacitor providing a short to ground for the RF signal.

11. The wireless communication device of claim 10, further comprising a voltage bias source connected to the second end of the stub for direct current (DC) biasing the transistor output.

12. The wireless communication device of claim 9, wherein the stub has a length approximately equal to ¼ of the wavelength of the fundamental frequency.

13. The wireless communication device of claim 9 wherein the first end of the stub provides a short circuit for the second harmonic of the fundamental frequency.

14. A method for positioning a shunt inductance stub along transmission line in a radio frequency (RF) amplifier circuit, wherein the stub has a first end connected to the transmission line and wherein the transmission line is coupled to an output of an active device having a fundamental frequency, the method comprising:
   adjusting the position of the stub along the transmission line until an impedance measurement at the output of the active device approximates a desired impedance corresponding to short circuit at a second harmonic of the fundamental frequency appearing at the semiconductor die of the active device.

15. The method of claim 14, further comprising connecting a second end of the stub to a voltage bias source.

16. The method of claim 15, further comprising connecting the second end of the stub to a grounded RF capacitor.

17. The method of claim 14, wherein the stub has a length approximately equal to ¼ of the wavelength of the fundamental frequency.

18. The method of claim 14 further comprising coupling an impedance matching network between the active device output and the transmission line.

19. The method of claim 14, wherein the active device is a RF transistor.

20. The method of claim 14, wherein the active device is a field effect transistor operated as a common-source amplifier.

* * * * *